United States Patent
Bogue et al.

(10) Patent No.: US 10,534,866 B2
(45) Date of Patent: Jan. 14, 2020

(54) INTELLIGENT PERSONA AGENTS FOR DESIGN

(71) Applicant: INTERNATIONAL BUSINESS MACHINES CORPORATION, Armonk, NY (US)

(72) Inventors: Adam Bogue, Framingham, MA (US); Daniel M. Gruen, Newton, MA (US)

(73) Assignee: International Business Machines Corporation, Armonk, NY (US)

( * ) Notice: Subject to any disclaimer, the term of this patent is extended or adjusted under 35 U.S.C. 154(b) by 1058 days.

(21) Appl. No.: 14/975,906

(22) Filed: Dec. 21, 2015

(65) Prior Publication Data

US 2017/0177991 A1 Jun. 22, 2017

(51) Int. Cl.
*G06F 17/50* (2006.01)
*G06Q 10/10* (2012.01)

(52) U.S. Cl.
CPC ........... *G06F 17/50* (2013.01); *G06Q 10/101* (2013.01)

(58) Field of Classification Search
None
See application file for complete search history.

(56) References Cited

U.S. PATENT DOCUMENTS

| | | | |
|---|---|---|---|
| 6,032,129 A * | 2/2000 | Greef | G06Q 30/06 705/26.43 |
| 6,295,535 B1 * | 9/2001 | Radcliffe | G06F 17/50 |
| 7,321,877 B2 * | 1/2008 | McKegney | G06Q 30/0601 705/51 |
| 8,635,637 B2 | 1/2014 | Krum et al. | |
| 8,655,695 B1 | 2/2014 | Qu et al. | |
| 8,914,372 B2 | 12/2014 | Cao et al. | |
| 10,080,117 B1 * | 9/2018 | Cerri | H04L 41/28 |
| 10,116,596 B2 * | 10/2018 | Li | H04L 51/02 |
| 2003/0191682 A1 | 10/2003 | Shepard | |

(Continued)

OTHER PUBLICATIONS

Repar Project, "Virtual Personas", Repar Project, <https://web.archive.org/web/20141220142456/http://www.repar-project.com/tools-methods/virlual-personas/>, Retrieved Aug. 27, 2019, pp. 1-3.

(Continued)

*Primary Examiner* — Paulinho E Smith
(74) *Attorney, Agent, or Firm* — Law Office of Jim Boice (57) ABSTRACT

A processor-implemented method, system, and/or computer program product generate an intelligent persona agent for use in designing a product. One or more processors input a persona specification into an intelligent persona agent generator. The persona specification describes attributes of a set of model users of a particular type of product, and the intelligent personal agent generator creates an intelligent persona agent that is a software-based version of the set of model users. The intelligent persona agent monitors intermediate design choices taken during a design of a product of the particular type of product by a design team. In response to the intelligent persona agent identifying an intermediate design choice that will lead to a feature that is in conflict with the persona specification of the intelligent persona agent, designers modify the intermediate design choice, which modifies the design of the product in order to create an improved product design.

20 Claims, 7 Drawing Sheets

(56) References Cited

U.S. PATENT DOCUMENTS

| | | | |
|---|---|---|---|
| 2004/0024722 A1* | 2/2004 | Naillon | G06N 5/043 |
| | | | 706/46 |
| 2004/0083261 A1* | 4/2004 | Thompson | G06N 5/043 |
| | | | 709/202 |
| 2005/0160145 A1* | 7/2005 | Gruen | G06Q 10/107 |
| | | | 709/206 |
| 2006/0020629 A1* | 1/2006 | Ramani | G06F 17/50 |
| 2008/0133325 A1 | 6/2008 | De | |
| 2008/0163054 A1* | 7/2008 | Pieper | G06Q 30/00 |
| | | | 715/706 |
| 2008/0262925 A1 | 10/2008 | Kim | |
| 2011/0106610 A1 | 5/2011 | Landis | |
| 2011/0288939 A1 | 11/2011 | Elvekrog | |
| 2012/0005131 A1* | 1/2012 | Horvitz | G06N 5/043 |
| | | | 706/11 |
| 2012/0042262 A1 | 2/2012 | Priyadarshan | |
| 2012/0066065 A1 | 3/2012 | Switzer | |
| 2012/0198378 A1* | 8/2012 | Gruen | G06Q 10/109 |
| | | | 715/772 |
| 2013/0054366 A1 | 2/2013 | Roundtree | |
| 2013/0144711 A1 | 6/2013 | Roundtree | |
| 2013/0161381 A1 | 6/2013 | Roundtree | |
| 2014/0052527 A1 | 2/2014 | Roundtree | |
| 2014/0136606 A1 | 5/2014 | Roundtree | |
| 2014/0244568 A1* | 8/2014 | Goel | H04W 4/08 |
| | | | 706/52 |
| 2014/0278992 A1 | 9/2014 | Roundtree | |
| 2014/0289180 A1* | 9/2014 | Pinel | G06Q 30/0204 |
| | | | 706/46 |
| 2014/0344953 A1 | 11/2014 | Roundtree | |
| 2015/0012355 A1 | 1/2015 | Efrat | |
| 2015/0066591 A1 | 3/2015 | Chourey | |
| 2015/0169156 A1* | 6/2015 | Van Der Westhuizen | G06F 3/011 |
| | | | 715/762 |
| 2015/0294216 A1* | 10/2015 | Baughman | G06F 17/2765 |
| | | | 706/11 |
| 2015/0302309 A1* | 10/2015 | Bartek | H04L 67/10 |
| | | | 706/11 |
| 2016/0140588 A1 | 5/2016 | Bracewell | |
| 2016/0189173 A1 | 6/2016 | King | |
| 2016/0203497 A1 | 7/2016 | Tietzen | |
| 2016/0253710 A1 | 9/2016 | Publicover | |
| 2017/0032384 A1 | 2/2017 | Harris | |
| 2017/0155601 A1* | 6/2017 | Ellis | H04L 51/02 |
| 2017/0177991 A1* | 6/2017 | Bogue | G06F 17/50 |
| 2017/0193537 A1* | 7/2017 | Gruen | G06Q 30/0204 |
| 2017/0193711 A1* | 7/2017 | Lenchner | G06T 19/20 |
| 2017/0201779 A1 | 7/2017 | Publicover | |
| 2019/0251593 A1* | 8/2019 | Allouche | G06Q 10/0639 |

OTHER PUBLICATIONS

P. Chou, "Identifying Prospective Customers", ACM, Proceedings of the Sixth ACM SIGKDD International Conference on Knowledge Discover and Data Mining, Aug. 1, 2000, pp. 447-456.

P. Mell et al., "The NIST Definition of Cloud Computing", National Institute of Standards and Technology, Information Technology Laboratory, Sep. 2011, pp. 1-7.

* cited by examiner

INTELLIGENT PERSONA AGENTS FOR DESIGN

BACKGROUND

The present disclosure relates to the field of computer systems, and specifically to the field of computer systems that display intelligent persona agents. Still more specifically, the present disclosure relates to creating and/or utilizing intelligent persona agents when designing a product.

SUMMARY

A processor-implemented method, system, and/or computer program product generate an intelligent persona agent for use in designing a product. One or more processors input a persona specification into an intelligent persona agent generator. The persona specification describes attributes of a set of model users of a particular type of product, and the intelligent personal agent generator creates an intelligent persona agent that is a software-based version of the set of model users. The intelligent persona agent monitors intermediate design choices taken during a design of a product by a design team, where the product is of the particular type of product. In response to the intelligent persona agent identifying an intermediate design choice that will lead to a feature that is in conflict with the persona specification of the intelligent persona agent, designers modify the intermediate design choice, which is used to modify the design of the product in order to create an improved product design.

DETAILED DESCRIPTION

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium is any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including, but not limited to, wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the present invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Designing a product, including a physical good (e.g., a pump) or software (e.g., an application program—"app") or a service (e.g., an advertising campaign) often involves the participation of multiple product designers. While these product designers may be human, in one or more embodiments they are machines. That is, a designing machine can autonomously receive sensor readings and, based on those sensor readings, design and/or manufacture a product.

During the design process, however, the voice of the users (human or mechanical) who will be using the product is often lost. That is, the users' voice is often lost during design sessions, as designers and product managers often work together without users being present. This can lead to suboptimal product designs, and the ignoring or forgetting of issues that would be important for a product's success. There are several practical reasons for this problem, including the cost and difficulty of having actual users available to participate in all the activities and decisions involved in a long design process, as well as confidentiality concerns that can limit what designers might like to discuss with outside parties.

The present invention addresses the problem stated above through a cognitive agent that simulates the presence of a real person (i.e., an intelligent persona agent) to simulate and inject reactions and feedback the real person(s) could be expected to give to the designs being created and discussed. This feedback is not at the end of the design product (i.e., the invention does not ask the persona if he/she likes the product and why or why not?), but rather is given during intermediate design choices. Often, such intermediate design feedback cannot be performed by a real person, as the real people available during the design session would not understand the impact of a particular design choice. And in many cases, no single real person would have the combination of technical expertise and in-depth understanding of the user domain to predict the implications of technical design choices. For example, assume that the intermediate design choice would be to use a particular processor in an electronic device (e.g., a smart phone). The design engineer may like this particular processor since it is reliable and matches other components in the electronic device. However, the design engineer will not know enough about how a real user will be utilizing the smart phone. That is, the design engineer will not have detailed information about how the smart phone will be used by this (class of) persons, their environment, their state, etc. Furthermore, a real user would have no idea whether or not this particular processor will result in a smart phone that he/she is happy with. The intelligent persona agent described herein is able to bridge this gap in knowledge. That is, the intelligent persona agent (also referred to herein as a "persona", "intelligent agent", "intelligent persona", "agent") knows 1) what the needs of the user are when using the smart phone, and 2) how this particular processor (selected at an intermediate design choice) will enable or hinder meeting these needs of the user.

The agent can provide such information to the designer through a number of channels and modalities, including, for example, synthesized speech, an animated avatar, or a realistic photo-realistic animated depiction of a person.

One goal of the present invention is to inject the customer perspective in a rich and palpable way in situations in which users cannot be present, or in which no single user represents the range of considerations that need to be addressed.

Similar functionality can also be used to inject reactions to advertisements and marketing campaigns, with reactions guided in part by a summarization of reactions in social media posts and other sources to similar concepts and campaigns.

A persona specification is input into the system, specifying specific certain details of an imagined user. Such input can be provided by a prospective user (e.g., by filling out a form or interactive dialog), captured from a system in which a persona specification is created (as described below), or based on data about a real person who is seen as representative of the specific user sub-community the persona is meant to represent. This specification can include information on the goals of the person, preferences, technology use, activities, concerns, etc.

In one or more embodiments, the persona does not represent a person, but rather a non-human system. For example, the persona may represent a submerged pipeline. As such, a "desire" or "need" of the system may be "Build a remotely controlled actuator that controls a valve on a pipeline that is under the Bering Sea". A knowledgeable design engineer may choose to use a particular control cable to control the actuator, which is made of stainless steel, since this may the standard way to design and manufacture such actuators. However, the persona receives sensor data for the particular area in the Bering Sea in which this actuator will be used. This sensor data reveals 1) a rise in temperature in this area due to global warming, and 2) increased seismic activity in the area. As such, using a physical cable that is unable to accommodate seabed movement, and/or using a type of stainless steel that expands in warmer waters to the point that it becomes stuck, are poor design choices. Thus, the persona (i.e., the submerged pipeline) is able to provide advice at intermediate design choices (i.e., deciding which type of control cable to use, which type of material to build the actuator from, etc.) that result in a product that satisfies the needs of the submerged pipeline.

Whether dealing with a persona that represents a human or a device, the system uses persona inputs as guidance to select additional details on the persona, by analysis of data on the people/devices who are meant to be represented by the persona. Some of these can be performed up front, others can be done on the fly as a topic arises.

For example, if a suggestion is made to place advertisements in pubs, the system could retrieve data to see whether the persona/person would be likely to attend a pub.

The system can access both structured, numerical data information such as on demographics, usage, and purchase patterns, as well as unstructured information including social media activity and images from which preferences, sentiment, prevalence of various themes (e.g., popular movies or popular clothing color choices) can be derived.

The system will monitor ongoing design discussion and design, identify specific statements and design decisions, evaluate them for appropriateness for the target users represented by the persona, and interject and contribute information as needed (based on a weighting of the importance of a contribution) or when explicitly asked. ("What do you think of the design so far?")

The persona can thus inject in a personal, potentially more compelling way, valuable information that can help the design or marketing team attend to issues they may have ignored, or to correct mistakes they might be making in areas such as:

Assumption checking (e.g., countering an assumption that the design should be focused on drivers by having the persona point out that "he/she—and many of his/her friends—don't have a car);

Providing feedback on design (such as stating "I don't use speech all that much" if a speech interface is being considered, or looking at the color scheme of a planned website and stating "most of the websites I use are more colorful"); and/or Technology choices (such as stating that he/she uses a smartphone every day).

Feedback from the persona can be positive as well ("I like that the receipts are automatically sent to me.")

In an embodiments of the present invention, multiple persona agents operate simultaneously, representing multiple user types and perspectives. Such agents are aware of each other's activity, enabling contributions such as "I agree, that would be a problem for me too" or "Actually, I did like that feature" when one persona "sees" another persona's input/evaluation.

Figure 1:
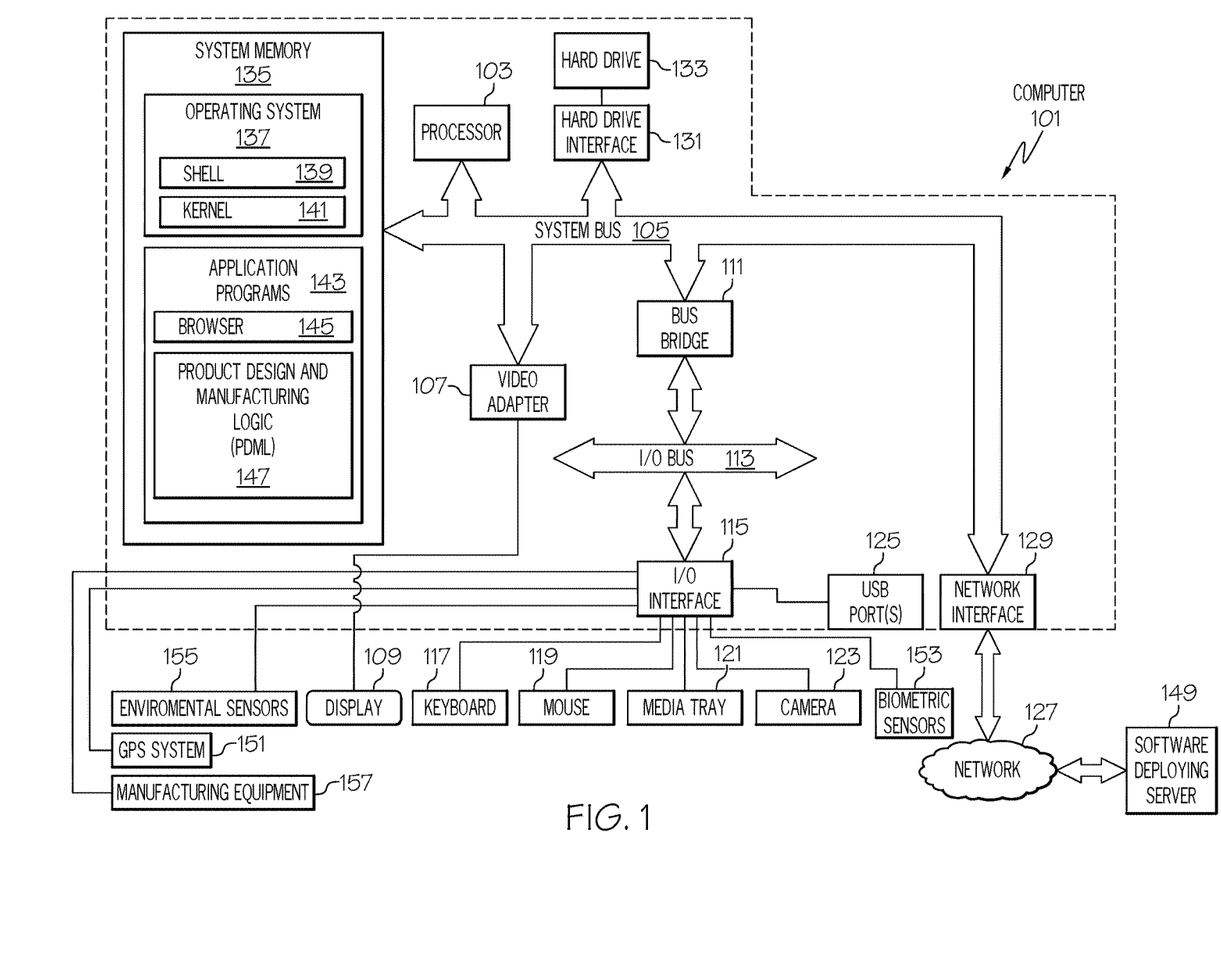
FIG. 1 depicts an exemplary system and network in which the present disclosure may be implemented.

With reference now to the figures, and in particular to FIG. 1, there is depicted a block diagram of an exemplary system and network that may be utilized by and in the implementation of the present invention. Note that some or all of the exemplary architecture, including both depicted hardware and software, shown for and within computer 101 may be utilized by software deploying server 149 shown in FIG. 1.

Exemplary computer 101 includes a processor 103 that is coupled to a system bus 105. Processor 103 may utilize one or more processors, each of which has one or more processor cores. A video adapter 107, which drives/supports a display 109, is also coupled to system bus 105. System bus 105 is coupled via a bus bridge 111 to an input/output (I/O) bus 113. An I/O interface 115 is coupled to I/O bus 113. I/O interface 115 affords communication with various I/O devices, including a keyboard 117, a mouse 118, a media tray 121 (which may include storage devices such as CD-ROM drives, multi-media interfaces, etc.), a camera 123 (capable of capturing still and/or video images), and external USB port(s) 125. While the format of the ports connected to I/O interface 115 may be any known to those skilled in the art of computer architecture, in one embodiment some or all of these ports are universal serial bus (USB) ports.

As depicted, computer 101 is able to communicate with a software deploying server 149 and/or client computer 151 using a network interface 129. Network interface 129 is a hardware network interface, such as a network interface card (NIC), etc. Network 127 may be an external network such as the Internet, a wireless cellular network, or an internal network such as an Ethernet or a virtual private network (VPN). In one or more embodiments, environmental sensors 155, GPS system 151, camera 123, biometric sensors 153, and/or manufacturing equipment 157 is accessible to computer 101 via network 127.

A hard drive interface 131 is also coupled to system bus 105. Hard drive interface 131 interfaces with a hard drive 133. In one embodiment, hard drive 133 populates a system memory 133, which is also coupled to system bus 105. System memory is defined as a lowest level of volatile memory in computer 101. This volatile memory includes additional higher levels of volatile memory (not shown), including, but not limited to, cache memory, registers and buffers. Data that populates system memory 135 includes computer 101's operating system (OS) 137 and application programs 143.

OS 137 includes a shell 139, for providing transparent user access to resources such as application programs 143. Generally, shell 139 is a program that provides an interpreter and an interface between the user and the operating system. More specifically, shell 139 executes commands that are entered into a command line user interface or from a file. Thus, shell 139, also called a command processor, is generally the highest level of the operating system software hierarchy and serves as a command interpreter. The shell provides a system prompt, interprets commands entered by keyboard, mouse, or other user input media, and sends the interpreted command(s) to the appropriate lower levels of the operating system (e.g., a kernel 141) for processing. Note that while shell 139 is a text-based, line-oriented user interface, the present invention will equally well support other user interface modes, such as graphical, voice, gestural, etc.

As depicted, OS 137 also includes kernel 141, which includes lower levels of functionality for OS 137, including providing essential services required by other parts of OS 137 and application programs 143, including memory management, process and task management, disk management, and mouse and keyboard management.

Application programs 143 include a renderer, shown in exemplary manner as a browser 145. Browser 145 includes program modules and instructions enabling a world wide web (WWW) client (i.e., computer 101) to send and receive network messages to the Internet using hypertext transfer protocol (HTTP) messaging, thus enabling communication with software deploying server 149 and other computer systems.

Application programs 143 in computer 101's system memory (as well as software deploying server 149's system memory) also include an Product Design and Manufacturing Logic (PDML) 147. PDML 147 includes code for implementing the processes described below, including those described in FIGS. 2-4. In one embodiment, computer 101 is able to download PDML 147 from software deploying server 149, including in an on-demand basis, wherein the code in PDML 147 is not downloaded until needed for execution. Note further that, in one embodiment of the present invention, software deploying server 149 performs all of the functions associated with the present invention (including execution of PDML 147), thus freeing computer 101 from having to use its own internal computing resources to execute PDML 147.

Computer 101 includes a positioning system, such as the depicted global positioning system (GPS) system 151 that utilizes space-based satellites to determine a geophysical location of computer 101 in real time.

Computer 101 also has access to one or more biometric sensors 153, which are able to detect body heat, pupil size, respiration, skin sweat, etc. used to determine the current physiological and/or psychological state of a user.

Computer 101 also has access to environmental sensors 155, such as microphones, light sensors, vibration sensors, etc. that detect a current environment state (e.g., noise, light, darkness, motion, earthquakes, etc.) of computer 101 (and particularly client computer 151).

Computer 101 also has access to manufacturing equipment 157, such as a three-dimensional (3D) printer, a robot, a computer aided manufacturing (CAM) system, etc. that builds physical products.

Note that the hardware elements depicted in computer 101 are not intended to be exhaustive, but rather are representative to highlight essential components required by the present invention. For instance, computer 101 may include alternate memory storage devices such as magnetic cassettes, digital versatile disks (DVDs), Bernoulli cartridges, and the like. These and other variations are intended to be within the spirit and scope of the present invention.

Figure 2:
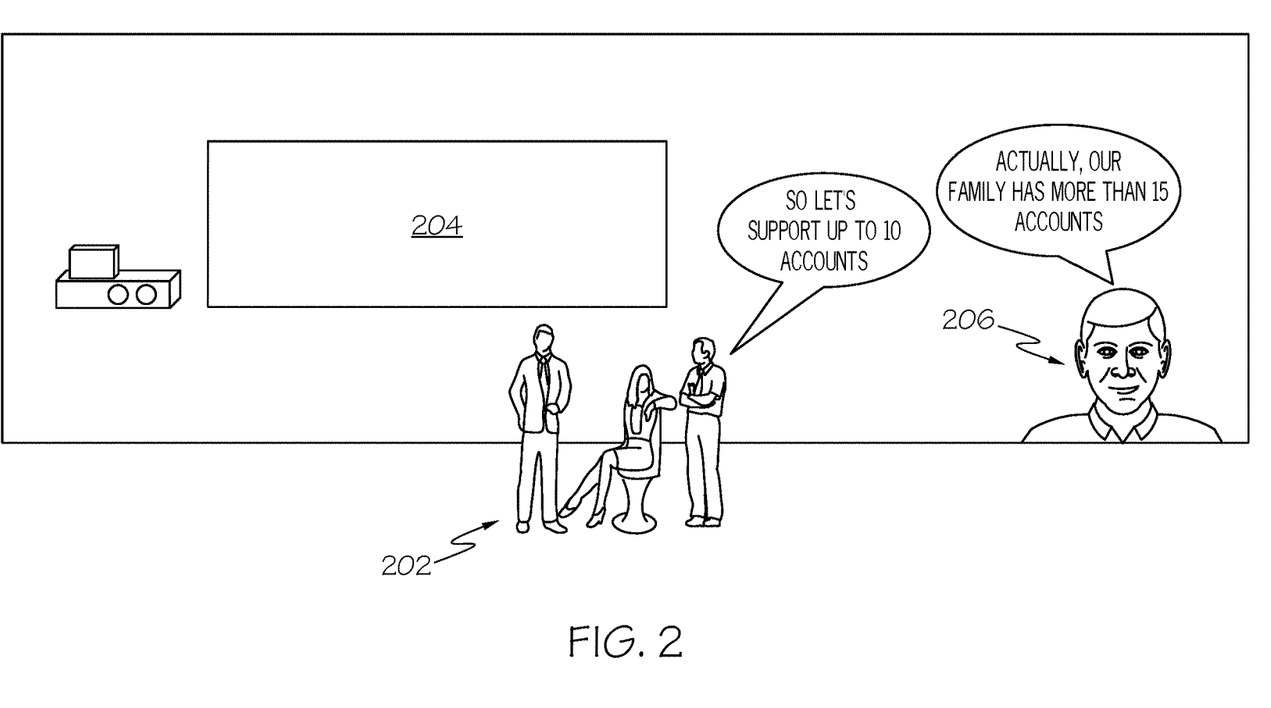
FIG. 2 illustrates an exemplary interaction between a design team and an intelligent persona agent in accordance with one or more embodiments of the present invention.

With reference now to FIG. 2, an exemplary interaction between a design team and an intelligent persona agent in accordance with one or more embodiments of the present invention is presented. A design team 202 is in the process of designing a product 204, which may be a good, software, a service, etc. Assume for explanatory purposes that product 204 is a device (e.g., a router) that supports 10 users. Members of the design team 202 will state "So let's support up to 10 accounts"). This verbalized statement is digitally converted into a format that is recognized by an intelligent persona agent 206. While depicted as representative of a potential user of the product 204, intelligent persona agent 206 may represent a group of human users in one embodiment. Furthermore, intelligent persona agent 206 may represent a device or set of devices (e.g., the subsea pipeline discussed above).

In one or more embodiments of the present invention, the intelligent persona agent 206 shown in FIG. 2 serves as an advocate for a group (or segment) of real users. As such, in this embodiment the initial specification of the intelligent persona agent 206 is based on data about that group. Thus, when evaluating design choices (as described herein), the intelligent persona agent 206 may refer back to data about that group that was not explicitly part of the initial specification about the intelligent persona agent 206. Thus, in the example shown in FIG. 2, the specification for the intelligent persona agent 206 may state that the person(s) represented by the intelligent persona agent 206 use their mobile devices to keep track of bank and credit card accounts, without stating specifically how many. When the intelligent persona agent 206 "hears" (i.e., receives an input from a design team/logic) that the system being designed will support no more than 10 accounts, the intelligent persona agent 206 will query data associated with the segment of people on which it is based (e.g., to see how many accounts people in that segment actually have), in order to determine if it needs to interject a comment to the design team/logic. Furthermore, the intelligent persona agent 206 may check on the statistics for the population as a whole (i.e., the group of users that is represents) even if specification data states that the group only has 8 accounts. As an advocate for the user group, the intelligent persona agent 206 may interject with "Actually, many families have more than 15 accounts.", thus providing for scalability/expansion in the product being designed.

Figure 3:
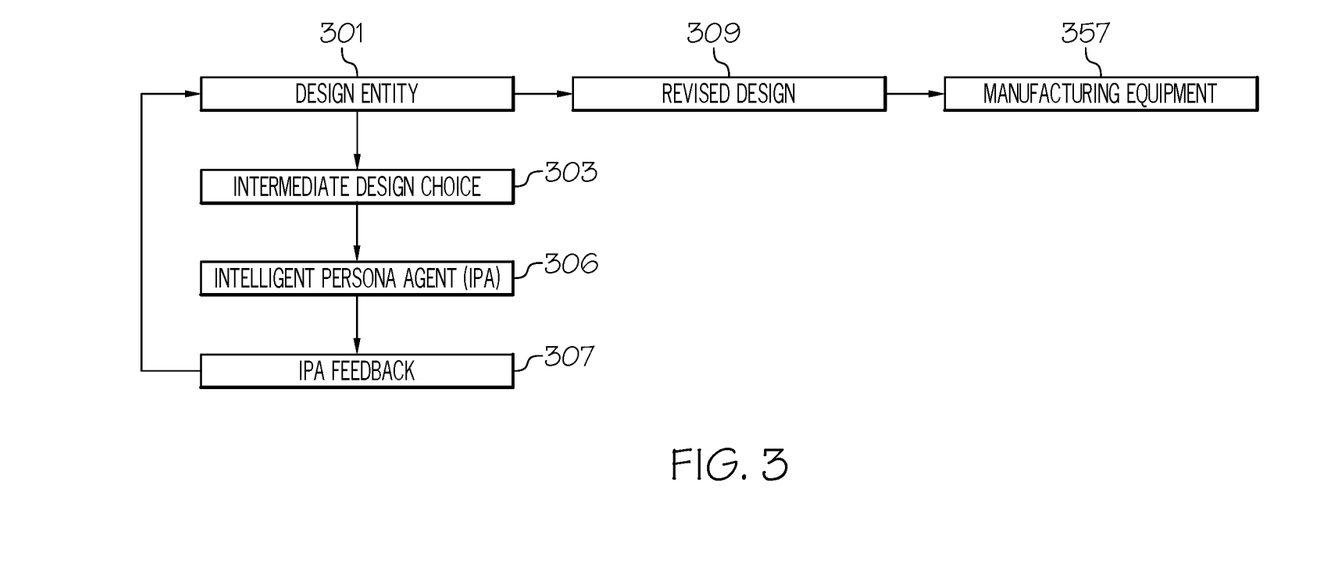
FIG. 3 depicts an exemplary overview of one embodiment of the present invention.

With reference now to FIG. 3, an exemplary overview of one embodiment of the present invention is presented.

A design entity 301 may be a group of persons (e.g., design team 202 shown in FIG. 2) or a software entity. If a group of persons, then the design entity 301 interacts with a intelligent persona agent 306 (analogous to the intelligent persona agent 206 shown in FIG. 2) using digitized voice inputs, text inputs, etc., thus providing the intelligent persona agent 306 with information describing the intermediate design choices being made by the design entity 301. If a software-based design program (i.e., an "intelligent" computer aided design program that is able to autonomously select various components for a product), the design entity 301 communicates directly with the intelligent personal agent 306 without human intervention. In either embodiment, the intelligent persona agent 306 can autonomously track the design choices made by the design entity 301, and then autonomously provide suggestions/comments/feedback to the design entity 301.

It is to be understood that the feedback from the intelligent persona agent 306 is not for a completed product. That is, the present invention does not use the intelligent persona agent 306 to review a completed product. Rather, the intelligent persona agent 306 is able to recognize intermediate design choices being made, how these intermediate design choices will impact the final design of the product, determine that this impact will be adverse to the needs of the final user, and then make recommendations to change the intermediate design choice to the design entity 301.

Thus, with reference again to FIG. 3, assume that design entity 301 is an intelligent computer aided design logic that can autonomously create a design for a particular product. For example, assume that design entity 301 is a program that creates code for controlling a three-dimensional (3D) printer, which creates a physical product overlays successive layers of material to create a physical product.

During the design process, design entity 301 chooses an intermediate design choice 303, such as "Apply Material X 3" from the bottom of Product A". Assume further that Product A is a vibration dampening cushion to be used placed between a bracket and a pump, and that Material X is material that expands when exposed to heat. The intelligent persona agent 306 is informed of this intermediate design choice 303. However, the intelligent persona agent 306 (which may be a component of PDML 147 shown in FIG. 1) has received sensor readings from environmental sensors 155 showing that these types of pumps 1) operate in very high temperature environments, and 2) are damaged if they are realigned with a pipe to which they are connected, particularly at a particular location (as determined by GPS system such as the GPS system 151 shown in FIG. 1. The design entity 301 may or may not be aware of this issue, particularly if it is anomalous and/or specific to the particular system/consumer represented by intelligent persona agent 306.

As such, the intelligent persona agent 306 will generate its intelligent persona agent feedback 307, such as "Expanding material in the vibration dampening cushion will cause the pump for which it is designed to fail due to pump/pipe misalignment when exposed to the high temperature in which this vibration dampening cushion will be used by System Z." This intelligent persona agent feedback 307 is then sent back to the design entity 301, which uses it to create a revised design 309. This loop is repeated until all intermediate design choices 303 for the particular product have been made.

The revised design 309 is then sent to the manufacturing equipment 357 (e.g., the 3D printer), which creates the product using code (e.g., computer executable instructions) from the revised design 309

Figure 4:
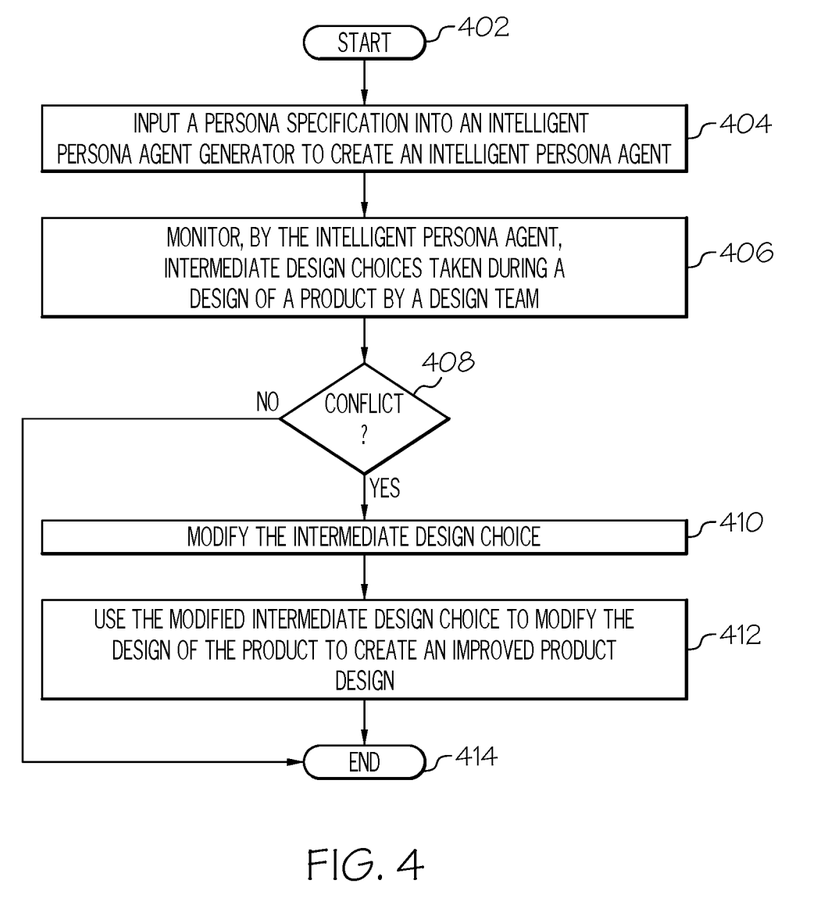
FIG. 4 is a high level flow chart of one or more steps performed by one or more processors and/or other hardware devices to generate an intelligent persona agent for use in designing a product in accordance with one or more embodiments of the present invention.

With reference now to FIG. 4, a high level flow chart of one or more steps performed by one or more processors and/or other hardware devices to generate an intelligent persona agent for use in designing a product in accordance with one or more embodiments of the present invention is presented.

After initiator block 402, one or more processors input a persona specification into an intelligent persona agent generator (e.g., part of PDML 147 shown in FIG. 1), as depicted in block 404. The persona specification describes attributes of a set of model users of a particular type of product. These model users may be persons (e.g., users of a device, software, a service such as an advertising campaign, etc.). The intelligent personal agent generator creates an intelligent persona agent (e.g., an avatar in the case of the model users being persons; a model of equipment in the case of the model users being equipment) that is a software-based version of the set of model users.

As described in block 406, the intelligent persona agent then monitors intermediate design choices taken during a design of a product by a design team (where the product is of the particular type of product). For example, assume that the design team (which may be a group of persons or a computer logic) is designing a product of Type A. As design choices are made by the design team, the intelligent persona agent monitors each design choice. Thus, the intelligent persona agent is not providing a review/feedback on the final product. Rather, the intelligent persona agent is providing a review/feedback related to each intermediate design choice. This requires the intelligent persona agent to be inextricably intertwined with the technology of receiving sensor data and being able to identify how such intermediate steps will impact the final product's ability to meet the need of the user/equipment.

As described in query block 408, the intelligent persona agent identifies any intermediate design choice that will lead to a feature that is in conflict with the persona specification of the intelligent persona agent. That is, if an intermediate design choice will ultimately result in a feature of the final product that does not meet the parameters of the user (i.e., product that can be used by a person who has low vision, a person who has a smartphone, a pipeline that lies on the seabed of the Bering Sea, etc.), then the intermediate design choice is modified (block 410).

As described in block 412, the modified intermediate design choice is then used to modify the design of the product to create an improved product design.

The flow chart ends at terminator block 414

In an embodiment of the present invention, one or more processors control operation of a manufacturing device using the improved product design. That is, as shown in FIG. 3 the revised design is then used to control manufacturing equipment 357 (e.g., an intelligent computer aided manufacturing (CAM) machine, a 3D printer, etc.).

In an embodiment of the present invention, the design team is a processor-based design logic. That is, the design of the product is performed by computer intelligence that receives product criteria as an input, and then assembles various (in one embodiment previously generated) design components into the final design.

In an embodiment of the present invention, one or more processors acquire the persona specification from a social media database. That is, if the user of the product is a person, then the persona specification learns about the attributes of this person (or persons having similar needs from the product) from social media websites.

In an embodiment of the present invention, one or more processors acquire the persona specification from a set of sensors associated with a set of physical devices. For example, assume that the model user is a pipeline sitting on the seabed of the Bering Sea. Sensors (e.g., digital thermometers, seabed movement sensors, etc.) on this physical device (e.g., the pipeline) provide sensor data that describes the attributes (including environmental conditions) of the pipeline.

In an embodiment of the present invention, one or more processors acquire the persona specification from a set of biometric sensors associated with a set of persons. For example, assume that an exemplary set of persons are wearing biometric sensors 153 shown in FIG. 1. These biometric sensors 153 reveal that these persons have a particular walking gait, have high blood pressure, are primarily sedentary, etc. Such information is used to determine the attributes of such persons, and thus is used to form the intelligent persona agent.

In an embodiment of the present invention, the product being designed is a good (e.g., a physical object). In another embodiment of the present invention, the product being designed is a service (e.g., an advertising campaign).

In one or more embodiments, the present invention is implemented in a cloud environment. It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Figure 5:
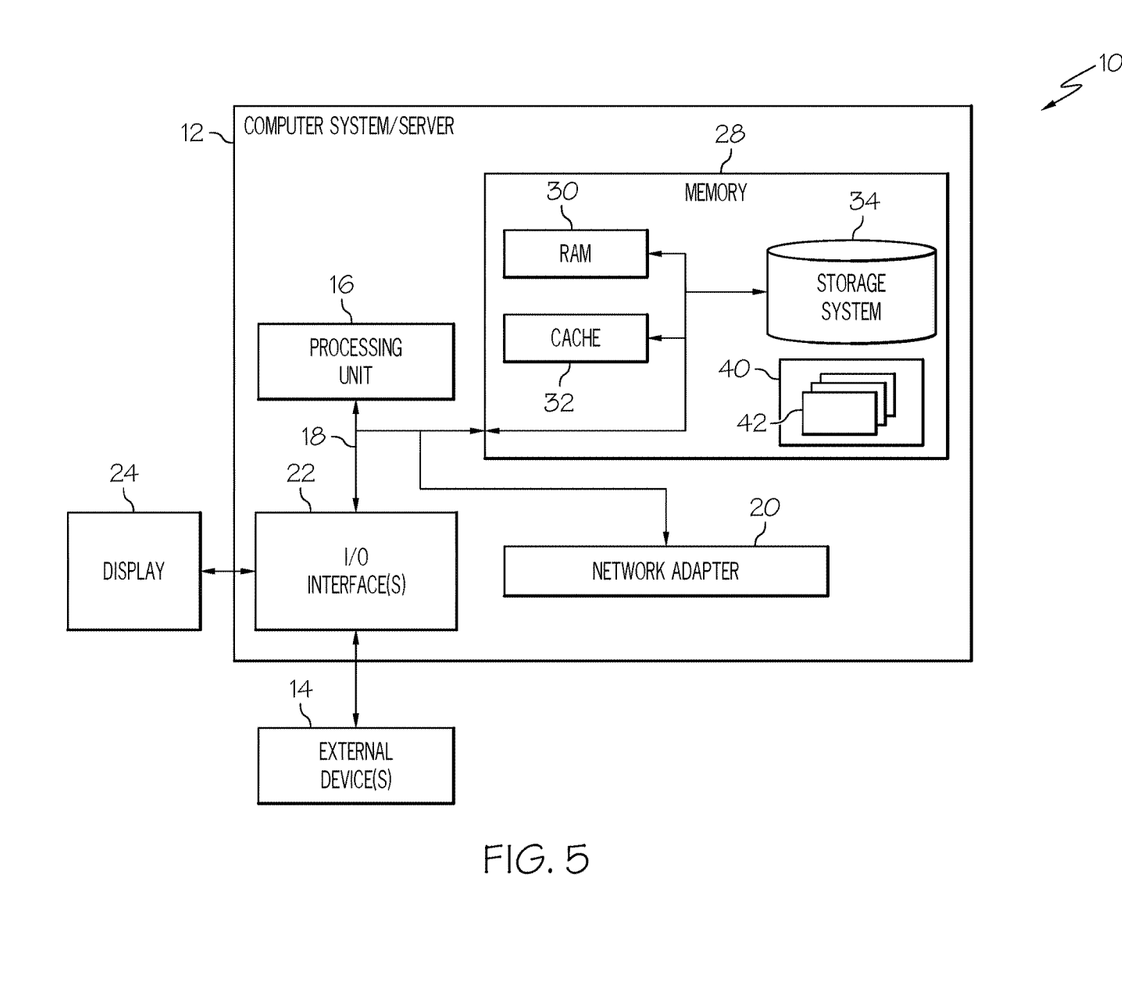
FIG. 5 depicts a cloud computing node according to an embodiment of the present disclosure.

Referring now to FIG. 5, a schematic of an example of a cloud computing node is shown. Cloud computing node 10 is only one example of a suitable cloud computing node and is not intended to suggest any limitation as to the scope of use or functionality of embodiments of the invention described herein. Regardless, cloud computing node 10 is capable of being implemented and/or performing any of the functionality set forth hereinabove.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 5, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

Figure 6:
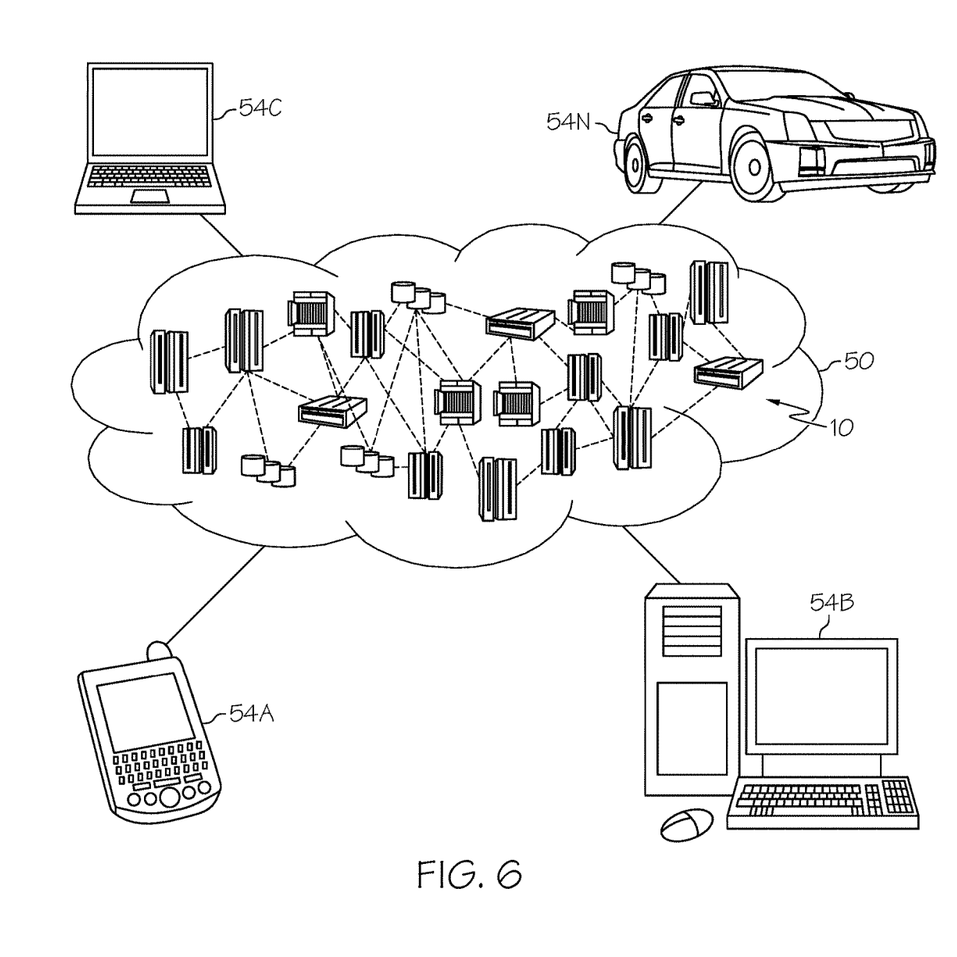
FIG. 6 depicts a cloud computing environment according to an embodiment of the present disclosure.

Referring now to FIG. 6, illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 6 are intended to be illustrative only and that computing nodes 10 and cloud computing environment 50 can communicate with any type of computerized device over any type of network and/or network addressable connection (e.g., using a web browser).

Figure 7:
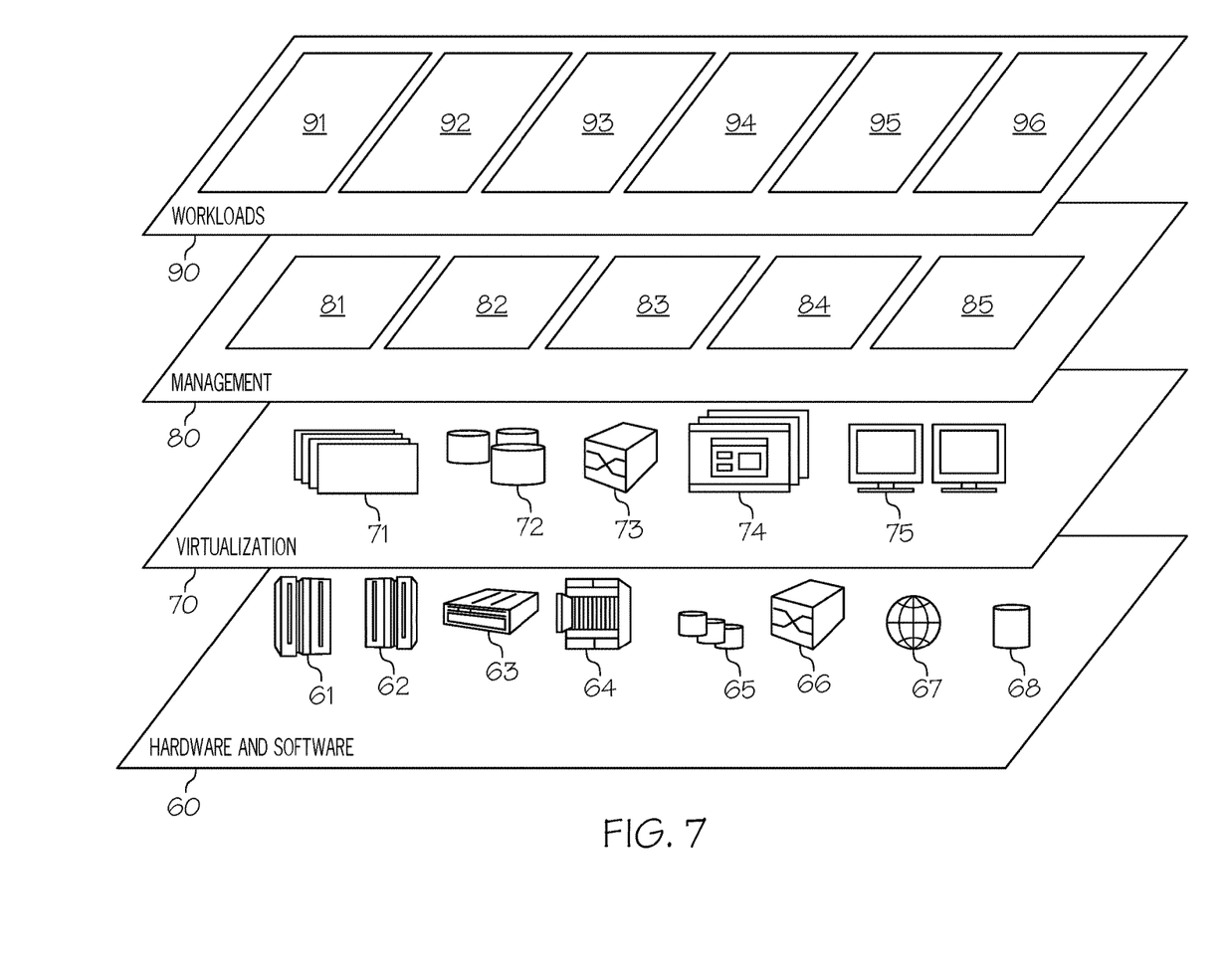
FIG. 7 depicts abstraction model layers according to an embodiment of the present disclosure.

Referring now to FIG. 7, a set of functional abstraction layers provided by cloud computing environment 50 (FIG. 6) is shown. It should be understood in advance that the components, layers, and functions shown in FIG. 7 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and intelligent persona agent processing 96 (for generating and utilizing intelligent persona agents as described herein).

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of various embodiments of the present invention has been presented for purposes of illustration and description, but is not intended to be exhaustive or limited to the present invention in the form disclosed. Many modifications and variations will be apparent to those of ordinary skill in the art without departing from the scope and spirit of the present invention. The embodiment was chosen and described in order to best explain the principles of the present invention and the practical application, and to enable others of ordinary skill in the art to understand the present invention for various embodiments with various modifications as are suited to the particular use contemplated.

Any methods described in the present disclosure may be implemented through the use of a VHDL (VHSIC Hardware Description Language) program and a VHDL chip. VHDL is an exemplary design-entry language for Field Programmable Gate Arrays (FPGAs), Application Specific Integrated Circuits (ASICs), and other similar electronic devices. Thus, any software-implemented method described herein may be emulated by a hardware-based VHDL program, which is then applied to a VHDL chip, such as a FPGA.

Having thus described embodiments of the present invention of the present application in detail and by reference to illustrative embodiments thereof, it will be apparent that modifications and variations are possible without departing from the scope of the present invention defined in the appended claims.

What is claimed is:

1. A processor-implemented method of generating an intelligent persona agent for use in designing a product, the processor-implemented method comprising:
   inputting, by one or more processors, a persona specification into an intelligent persona agent generator, wherein the persona specification describes attributes of a set of model users of a particular type of product and features of the particular type of product that are desired by the set of model users, and wherein the intelligent persona agent generator creates an intelligent persona agent that is a software-based version of the set of model users;
   monitoring, by the intelligent persona agent, intermediate design choices taken during a design of a product by a design team, wherein the product is of the particular type of product;
   in response to the intelligent persona agent identifying an intermediate design choice that will lead to a feature that is in conflict with the persona specification of the intelligent persona agent, modifying the intermediate design choice to create a modified intermediate design choice; and
   using the modified intermediate design choice to modify the design of the product to create an improved product design.

2. The processor-implemented method of claim 1, further comprising:
   controlling, by one or more processors, operation of a manufacturing device using the improved product design.

3. The processor-implemented method of claim 1, wherein the design team is a processor-based design logic.

4. The processor-implemented method of claim 1, further comprising:
   acquiring, by one or more processors, one or more features of the persona specification from a social media database.

5. The processor-implemented method of claim 1, further comprising:
   acquiring, by one or more processors, one or more features of the persona specification from a set of sensors associated with a set of physical devices.

6. The processor-implemented method of claim 1, further comprising:
   acquiring, by one or more processors, one or more features of the persona specification from a set of biometric sensors associated with a set of persons.

7. The processor-implemented method of claim 1, wherein the product is a good.

8. A computer program product for generating an intelligent persona agent for use in designing a product, the computer program product comprising a non-transitory computer readable storage medium having program code embodied therewith, the program code readable and executable by a processor to perform a method comprising:
   inputting a persona specification into an intelligent persona agent generator, wherein the persona specification describes attributes of a set of model users of a particular type of product and features of the particular type of product that are desired by the set of model users, and wherein the intelligent persona agent generator creates an intelligent persona agent that is a software-based version of the set of model users;
   monitoring, by the intelligent persona agent, intermediate design choices taken during a design of a product by a design team, wherein the product is of the particular type of product;
   in response to the intelligent persona agent identifying an intermediate design choice that will lead to a feature that is in conflict with the persona specification of the intelligent persona agent, modifying the intermediate design choice to create a modified intermediate design choice; and
   using the modified intermediate design choice to modify the design of the product to create an improved product design.

9. The computer program product of claim 8, wherein the method further comprises:
   controlling operation of a manufacturing device using the improved product design.

10. The computer program product of claim 8, wherein the design team is a processor-based design logic.

11. The computer program product of claim 8, wherein the method further comprises:
    acquiring one or more features of the persona specification from a social media database.

12. The computer program product of claim 8, wherein the method further comprises:
    acquiring one or more features of the persona specification from a set of sensors associated with a set of entities.

13. The computer program product of claim 8, wherein the product is a good.

14. The computer program product of claim 8, wherein the product is an advertising campaign.

15. A computer system comprising:
    a processor, a computer readable memory, and a non-transitory computer readable storage medium;
    first program instructions to input a persona specification into an intelligent persona agent generator, wherein the persona specification describes attributes of a set of model users of a particular type of product and features of the particular type of product that are desired by the set of model users, and wherein the intelligent persona agent generator creates an intelligent persona agent that is a software-based version of the set of model users;
    second program instructions to monitor, by the intelligent persona agent, intermediate design choices taken during a design of a product by a design team, wherein the product is of the particular type of product;
    third program instructions to, in response to the intelligent persona agent identifying an intermediate design choice that will lead to a feature that is in conflict with the persona specification of the intelligent persona agent, modify the intermediate design choice to create a modified intermediate design choice; and
    fourth program instructions to use the modified intermediate design choice to modify the design of the product to create an improved product design; and wherein the first, second, third, and fourth program instructions are stored on the non-transitory computer readable storage medium for execution by one or more processors via the computer readable memory.

16. The computer system of claim 15, further comprising:
fifth program instructions to control operation of a manufacturing device using the improved product design; and wherein
the fifth program instructions are stored on the non-transitory computer readable storage medium for execution by one or more processors via the computer readable memory.

17. The computer system of claim 15, wherein the design team is a processor-based design logic.

18. The computer system of claim 15, further comprising:
fifth program instructions to acquire one or more features of the persona specification from a social media database; and wherein
the fifth program instructions are stored on the non-transitory computer readable storage medium for execution by one or more processors via the computer readable memory.

19. The computer system of claim 15, further comprising:
fifth program instructions to acquire one or more features of the persona specification from a set of biometric sensors associated with a set of persons; and wherein
the fifth program instructions are stored on the non-transitory computer readable storage medium for execution by one or more processors via the computer readable memory.

20. The computer system of claim 15, wherein the product is a good.

* * * * *